United States Patent [19]

Boynton

[11] 3,966,110
[45] June 29, 1976

[54] STABILIZER SYSTEM WITH ULTRASONIC SOLDERING

[75] Inventor: Kenneth G. Boynton, Milford, N.H.

[73] Assignee: Hollis Engineering, Inc., Nashua, N.H.

[22] Filed: Mar. 11, 1975

[21] Appl. No.: 555,271

Related U.S. Application Data

[63] Continuation-in-part of Ser. No. 508,052, Sept. 23, 1974.

[52] U.S. Cl. .............................. 228/175; 228/18; 228/37; 228/179; 228/180 R; 228/262
[51] Int. Cl.² .................. B23K 31/02; B23K 1/08
[58] Field of Search .......... 228/110, 111, 122, 123, 228/124, 179, 180, 175, 176, 203, 212, 213, 262, 1, 4.5, 5.1, 18, 37; 29/626; 174/68.5

[56] References Cited
UNITED STATES PATENTS

| 2,784,481 | 3/1957 | Kitterman | 228/179 X |
| 2,983,853 | 5/1961 | Williams | 29/626 |
| 3,158,927 | 12/1964 | Saunders | 29/626 X |
| 3,388,465 | 6/1968 | Johnston | 228/180 X |
| 3,616,533 | 11/1971 | Heap et al. | 228/180 X |
| 3,704,515 | 12/1972 | Nelson | 29/626 |
| 3,825,994 | 7/1974 | Coleman | 228/37 X |
| 3,835,531 | 9/1974 | Luttmer | 228/262 X |
| 3,888,639 | 6/1975 | Hastings et al. | 228/175 X |

Primary Examiner—Al Lawrence Smith
Assistant Examiner—Margaret Joyce
Attorney, Agent, or Firm—Schiller & Pandiscio

[57] ABSTRACT

An ultrasonic soldering system is described. Electrical and electronic components are assembled in a circuit board with their leads extending through holes in the board. The components are temporarily held in position in the board by means of a solid, solder-compatible, stabilizer material having a melting point below that of solder, which material couples the board and leads to one another. The component leads are then trimmed to finish length, and after trimming, the components are soldered in place utilizing vibratory energy in a body of molten solder. The vibratory energy in the solder scrubs the board and leads removing oxides and allowing wetting, thus eliminating the need for application of fluxes and surface preparation prior to soldering. The stabilizing material is melted and displaced simultaneously with soldering.

28 Claims, 6 Drawing Figures

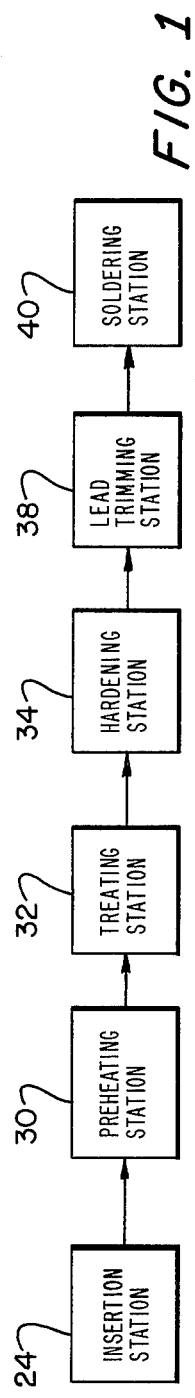
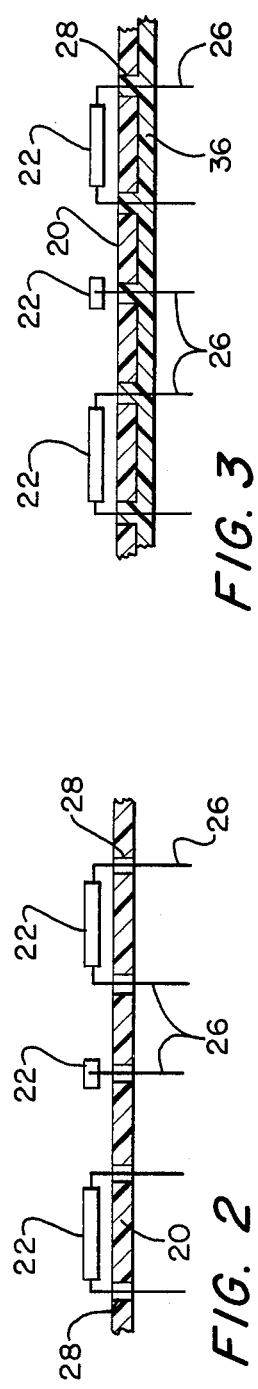
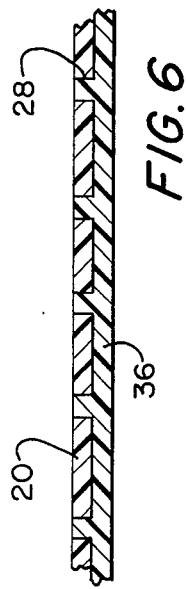
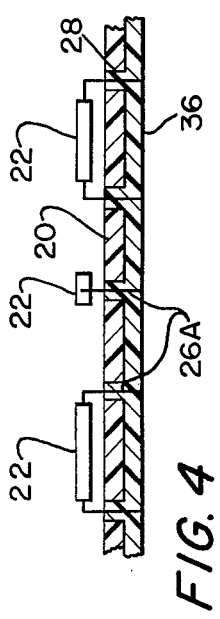
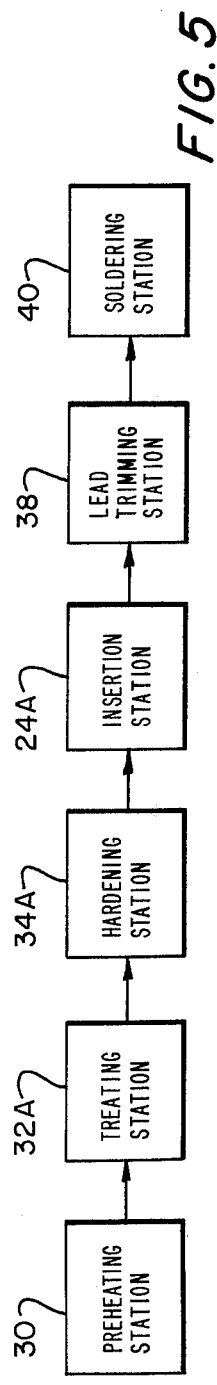

STABILIZER SYSTEM WITH ULTRASONIC SOLDERING

The present invention is a continuation-in-part of my copending application Ser. No. 508,052, filed Sept. 23, 1974.

The present invention relates to systems for assembling electrical and electronic components onto substrate circuit boards, and more specifically to systems for mass soldering components onto printed circuit boards utilizing vibrational energy.

Numerous process and apparatus are well known in the art for mounting electrical and electronic components onto printed circuit boards. In general such methods comprise positioning the components onto a board, soldering the leads of the component to the board, and cutting off the component excess leads.

A typical circuit board assembly may involve a substantial number of components, and to connect each of these components to the board individually with a soldering iron is a tedious process. Accordingly, the art has proposed various systems by which a plurality of component connections to a board may be effected in a single or mass soldering operation. One type of mass soldering system involves a so-called "dip soldering" or pot soldering technique. In this type of system, an entire side of the circuit board assembly containing the printed conductors, with the leads from the circuit components projecting through various holes in the board, is briefly immersed or dipped into a body of molten solder, removed and cooled.

Another system involves passing the board through a moving stream of solder, typically in the form of a wave, i.e., a so-called "wave soldering" technique. Various wave soldering techniques form the basis of numerous patents and are described in detail in U.S. Pat. Nos. 2993272, 3004505, 3037274, 3039185, 3056370, 3058441, 3082520, 2100471, 3196829, 3207128, 3216642, 3217959, 3266139, 3277566 and others. A basic requirement of all soldering systems is to thoroughly clean the component leads and the board printed conductors prior to soldering to remove metallic oxides and other films which otherwise would interfere with wetting of the metallic surfaces by the molten solder. Cleaning may be accomplished by treating the metallic surfaces prior to soldering with a chemical cleaning agent containing a so-called "flux" active agent, typically, an inorganic or carboxylic acid, an amine, amide, quaternary ammonium salt or a halogen salt. While chemical cleaning agents may perform an adequate cleaning function in most cases, flux residues left on the board may adversely effect the performance or life of the circuit board, particularly in cases where acid or corrosive-type fluxes are used. And, while most flux residues may be removed from a soldered board by subsequent cleaning operations, removal may require a number of cleaning operations including the requirement of specially designed cleaning apparatus, and using organic solvents and/or deionized water, all of which may add appreciably to capital and operating costs. Furthermore, flux or flux gases may be included within solder joints, causing poor soldering, and cannot be removed even by cleaning. Additionally, accumulation of flux residues in the solder bath or solder wave may present additional soldering problems.

Various vibratory soldering systems have been proposed by the art for soldering without flux and are described in detail in U.S. Pat. Nos. 2671264, 3084650, 3249281, 3266136, 3277566, 3303983, and others. In ultrasonic soldering, vibrational energy is imparted to a body of molten solder. This results in cavitation of the molten solder adjacent the surfaces of the component leads and the circuit lands, thus imparting a scrubbing action to the surfaces to be joined, removing oxides and allowing melting, thus eliminating the need for the application of fluxes and surface preparation prior to soldering. Due to the relatively high density of the molten solder, energy waves are transmitted only a short distance in the solder. Thus, in ultrasonic soldering the vibratory generators must be positioned quite close to the surfaces being soldered, e.g. typically within about ¼ inch of the surfaces, in order to provide effective solder cavitation at the surface. Accordingly, in a typical ultrasonic soldering system, the component leads are pre-cut to finish length, the components are then loaded in position in the board; and, the leads are then bent or crimped to mechanically mount the components in the board prior to soldering. As will be expected, length of the pre-bent, pre-cut leads is critical. Too short leads and the component may fall out of the hole before soldering. Too long leads may interfer with the vibratory generators, and may require additional trimming after soldering in any event. Furthermore, these operations may add appreciably to production costs, and may require special equipment. Additionally, relatively long component leads are generally desired to facilitate inserting the components onto the board. By the same token, some lead excess length is also generally desirable to minimize the possibility that components will be displaced in handling the boards prior to soldering.

Accordingly, the art typically has used ultrasonic or vibratory soldering techniques only in limited situations where specifications call for substantially complete elimination of flux residues.

A principal object of the present invention is therefore to provide an improved apparatus, and method and materials for asssembling and mass soldering of circuit boards. Another object is to provide a new and improved system for mass soldering, of components to circuit boads without prior fluxing.

A further object is to provide apparatus and process which embodies a new and improved system and means for assembling soldering of circuit boads using vibrational energy in the soldering step. Yet other objects will in part appear obvious and will in part appear hereinafter.

The invention accordingly comprises the processes involving the several steps and the relative order of one or more such steps with respect to each other, and the apparatus possessing the features, properties and relations of elements which are exemplified in the following detailed disclosure and the scope of the application of which will be indicated in the claims.

In my co-pending application Ser. No. 469,536, I disclose a system of stabilizing electrical and electronic components in printed circuit boards so that the component leads may be cut to finish length prior to soldering the components to the board. According to my aforesaid application Ser. No. 469,536, the components are mounted in position in a circuit board with their leads extending through holes in the board. Then a selected material (or mixture of materials) is applied to the board, and the material is hardened in liquid state to form a solid solder-compatible, cement physically coupling or stabilizing the leads and board. The component leads may then be trimmed to finish length, and the leads soldered in place in a single mass soldering step. Fluxing may be applied prior to or simultaneously with the application of the stabilizing material. The cement is said to be removed by melting simultaneously with the soldering step. A wide range of materials are said to be useful as the cement in accordance with the teachings of my aforesaid application Ser. No. 469,536.

A modification of this system is disclosed in my copending application Ser. No. 508,052, filed Sept. 23, 1974. According to this latter application, flux and a stabilizer material are applied to a circuit board prior to loading the components in position in the board. The flux and the stabilizer material may be applied simultaneously, or the flux may be applied in a separate prior step. The stabilizer material coats the board at least in part, and at least partially fills the holes in the board. The components are then loaded in position on the board by pushing the leads through the holes, into and/or through the stabilizer material. Many of the materials said to be useful in my aforesaid application Ser. No. 469,536 are equally useful in my application Ser. No. 508,052, the critical requirement in the latter case being that the stabilizer material is somewhat soft or pliable as compared to the component leads so that the leads may imbed into, or penetrate material in their paths, and the material acts as a jig to maintain the desired positional relationship between the board and the components. Lead trimming and soldering is then otherwise as in accordance with my aforesaid application Ser. No. 469,536.

Generally, the present invention involves a system of mass soldering components to circuit boards using vibrational energy in which the component leads are trimmed prior to soldering. The components are temporarily held in position on the board by a solder-compatible stabilizer material which is removed in the soldering operation. In one embodiment of the invention the components are loaded in position on the board, and the board is then coated with stabilizer material which couples the components and board. In another embodiment the board is first coated with stabilizer material and the components are then loaded in position on the board into and/or through the material. With either embodiment, the stabilizing material should not decompose at soldering temperatures, but instead should have a melting point or liquidus temperature below the molten solder. Component leads are then trimmed to finish length, and the leads may then be soldered in place in a single soldering step utilizing vibratory energy. The vibratory energy in the solder scrubs the board and leads removing oxides and allowing wetting, thus eliminating the need for application of fluxes and surface preparation prior to soldering. The stabilizer material melts in contact with the molten solder, and is removed by scrubbing simultaneously with the soldering step.

For a fuller understanding of the nature and objects of the present invention, reference should be had to the following detailed description taken in connection with the accompanying drawings wherein like numerals denote like elements, and:

FIG. 1 is a side elevational view, diagrammatically illustrating a soldering system according to the present invention;

FIG. 2 is an enlarged side elevational view, in section, showing a circuit board assembly at a beginning stage in the process of the present invention;

FIG. 3 is an enlarged side-elevational view, in section showing a circuit board assembly at an intermediate stage in the process of the present invention;

FIG. 4 is an enlarged side-elevational view, in section, showing a circuit board assembly at another intermediate stage in the process of the present invention;

FIG. 5 is a side-elevational view, diagrammatically illustrating an alternative soldering system according to the present invention; and FIG. 6 is an enlarged, side-elevational view, in section, showing a circuit board assembly at an intermediate stage in an alternative process of the present invention.

In the following detailed description of the present invention, the term "component lead" refers to that part of metallic conductor of an electrical or electronic component that is joined to the printed circuit pattern, i.e., the component leads, terminals, lugs, etc. The term "land" as used herein refers to that part of the metallic pattern on the printed circuit to which the lead is joined.

The terms "liquid" and "solid" which are used herein with reference to physical properties of the stabilizer materials, are to be understood as referring to such properties as they exist under conditions as may be specified. For example, the term "solid" then refers to a state wherein the elements of a matrix or lattice structure of a material exhibit spatial orientation which is substantially static or fixed over ordinary time periods during which the property of solidity is significant or required. The terms "harden" and "melt" which are used herein, are to be understood as referring to the process in which the material, either crystalline or amorphous, goes through in changing from a liquid to a solid, or vice versa. For example, the term "harden" may thus refer to a classical phase change wherein a liquid is cooled to below it solidus temperature. However, the term "harden" is not intended to be so limited, and may include, for example, (1) evaporating the solvent from a solution containing the selected material leaving a solid, and (2) polymerizing a liquid monomer to a solid polymer. And, the terms "hard", "soft" and "penetrable" refer to relative physical properties of specified materials as they exist under stated conditions where the context so requires. For example, the metallic leads on an electrical and electronic component may thus be said to be "hard" as compared, for example, to a coating or stabilizing material comprising beeswax. The latter would thus be considered to be "soft" and also "penetrable" with respect to the metallic leads.

While there are a large number of materials which can be used as stabilizer material in accordance with the technique of the present invention, the preferred materials are those which are normally solid under ambient conditions, which melt or congeal at a temperature in the range of from about 120° to 205°F, and are also thermally stable at the temperature of liquid solder. The stabilizer material may comprise a non-elastically deformable material such as crystalline wax, or the stabilizer material may be resiliently deformable, e.g. an amorphous wax. Among suitable materials may be mentioned naturally occurring waxes such as vegetable waxes, e.g. *Euphorbia cerifera* (Candelilla), *Corzpha cerifera* (Carnauba), *Stipa Tenacission* (Esparto),

*Syagrus coronata* (Ouricury), *Rhus succedaneum* (Japan wax); animal waxes, e.g. *Apis mellifera* (Beeswax), *Coccus cerifera* (Chinese insect wax); petroleum derived mineral waxes, e.g. Ceresine, Ozocerite, Microcrystalline, and, Montan waxes. Also a number of synthetic waxes (so-called "Fischer-Tropsch" waxes) are available commercially, will satisfy the aforesaid criteria and are useful in accordance with the technique of the present invention. Additionally, certain polymers and resins such as polyethylene, polybutene, polyindene, polyvinyl acetate, dipentene resins, and alkyl resins can be used to achieve the advantages of the instant invention. Of these latter compounds, particularly preferred are the higher molecular weight Carbowax compounds available from Union Carbide Company, New York, N.Y. The manufacturer describes these compounds as comprising polyethylene glycols and methoxypolyethylene glycols. The compounds are available in molecular weights ranging from about 200 to about 20,000, the higher molecular weight compounds of this series being solid at ambient conditions. Furthermore, such compounds are said to have good thermal stability, and they are completely or at least substantially soluble in water. This latter property is particularly advantageous as it permits water clean-up of any residuals on the board. The polymers and resins may be applied either as a hot melt, or in approximate cases, the polymer or resin may be applied as a solution or dispersion in a solvent or carrier, and stabilized or hardened by evaporation of solvent or carrier, or by fusing, all as well known in the art. Alternatively, such polymers and resins may be applied as a liquid monomer, or as a solution or dispersion containing the monomer, and the monomer is then hardened by polymerization, e.g. as by application of heat or ultraviolet light or by treating with a curing agent or polymerization catalyst. Some of these polymers and resins are found to have relatively hard skins when they are fully cured. Thus, in such instances in which the board is treated with the material prior to assembling the components onto the board, to facilitate subsequent assembling, it may be necessary or desirable to load the components onto the board before the polymer or resin is fully hardened or cured. Such materials are considered thus to be "soft, penetrable and solder-compatible" for purposes of this invention.

The stabilizing material melts upon exposure of the board to the liquid solder and typically forms a liquid layer which floats on the body of liquid solder. Depending on the particular stabilizer material, the liquid layer may surpress dross and may also reduce surface tension in much the same way that tinning oil does. Excess stabilizer material may be removed from the system by skimming or the like techniques. It will also be understood that materials that evaporate or sublime at the temperature of liquid solder may also be used as stabilizer material in accordance with the techniques of the present invention, thus are also intended to be included herein. Obviously, mixtures of compatible waxes, polymers, etc. may also be used in accordance with the teachings of the present invention.

While there are many techniques for applying the stabilizer material, the preferred method involves treating the board (and the leads of any components thereon) with a moving body of coating material, e.g. as by passing the circuit board through a wave of the material in liquid state, or by spraying. Both of these methods apply the material so that it forms a coating on the board, (and component leads) and also at least partially fills the holes in the board. Preferably, the stabilizer material will not be deposited on the component bodies, however. The amount of material applied will depend, in part, on whether the components are loaded onto the board before or after treating with the stabilizer material. If the components are already on the board, the amount of stabilizer material required to "lock" or "cement" the components in position may be quite small. On the other hand, in instances where the board is coated prior to loading, the material preferably will be applied to the board so as to form a coating on a surface of the board which, when solidified, has thickness in the range of about 0.002 to 0.030 inch.

Generally, in one embodiment of the invention, the components are loaded in position on the board, the stabilizer is applied to the board surface and component leads in molten state, and the coated board is then cooled for a time at a temperature sufficient to solidify the material on the boards and leads, and thereby stabilize or "cement" the components to the board. For example, where the material is beeswax, the wax is heated to about 155°–160°F to form the melt; the molten wax is applied to the board; and the board is then cooled to below the liquidus temperature of the wax, e.g. as by forced cool air to solidify the molten wax on the board. Other materials require different hardening operations as will be clear from the description following.

Alternatively, and in the embodiment of the invention where the board is coated with stabilizer material prior to assembling with the components, the components are then loaded in position on the board by pushing the leads through the material. The material surrounds the leads for a distance, and thus stabilizes the components, and maintains a desired positional relationship between the board and the components. If desired, the components may be loaded on the board before the coating material has fully solidified on the board, whereby the material may flow and surround the component leads as the material continues to harden. Alternatively, the components may be loaded in the board after the coating has fully solidified, and, if desired, the loaded board may be heated to melt and to partially reflow the coating material. However, it is sufficient for many purposes to simply load the components through the hardened material without having to reflow the material, particularly in cases where the material is amorphous.

An important and critical feature of the present invention is the ability to temporarily stabilize components in a circuit board so that the component leads may be trimmed or cut very close to the bottom surface of the board without displacing the components. As a result the components may then be soldered to the board utilizing vibratory or ultrasonic energy in a body of solder.

One embodiment of this invention is shown in the FIGS. 1–4 of the drawings. Referring to FIGS. 1 and 2 of the drawings, a printed circuit board 20 is loaded, at an inserting station 24, with a plurality of electrical or electronic components 22 at predetermined positions on board 20. The components may be inserted in the board by any method known in the art which may include manual assembly, semi-automatic, or automatic assembly which may comprise single-station or multiple-station pantagraph or numerically controlled machines all of which are well known in the art and need not be further described. It should be noted at this stage, components 22 are loosely mounted in the circuit board 20 with their leads 26 extending through holes 28 in the board. Furthermore, leads 26 are somewhat longer than will be desired or required in the completed circuit assembly and typically the leads also project too far from the board to permit ultrasonic soldering. On the other hand, leads longer than necessary are desired at this state to facilitate positioning and assembly, and also to minimize the risk that components may be displaced from their desired positions in subsequent operations.

The loaded board is then passed to a preheating station 30 wherein the board is preheated to a topside temperature in the range of from about 125° to 150°F prior to treating the circuit board and component leads at station 32, with stabilizer material.

The stabilizer material is applied to the board and leads in a liquid state at station 32 by any manner well know in the art for applying a liquid, as for example, by spraying or dip coating. Preferably, however, the stabilizer material is applied from a wave of the liquid. The liquid material coating on the board is then hardened at station 34 to form a "cement" 36 coupling the board and leads (see FIG. 3). The construction of station 34 will be determined by the hardening operation required, which in turn is dependent on the nature of the material. For example, where the material is applied as a melt, station 34 should include means to cool the coated board to solidify the material. Thus, station 34 may include a chill box or the like. On the other hand, depending on the nature of the material, the latter's liquidus temperature and the temperature of the ambient air, the material may harden as the board is transported between station 32 and trimming station 38. In such case station 34 will not constitute a separate defined work station. Station 34 may comprise other constructions. For example, where the material is applied from a dispersion or solution, station 34 should include means for speeding evaporation of the solvent or liquid carrier, e.g. a source of heated air flow. And, where the material is applied as a monomer, station 34 should include means for effecting or accelerating polymerization of the monomer, and may include, for example, a heat source or source of ultra violet light (depending on the nature of the polymerization), or may include means for applying a curing agent, catalyst or the like to the liquid material coating the board.

Once the stabilizer material is substantially hardened, the board is passed to trimming station 38 wherein the component excess leads are cut to finish length, e.g. 1/18 inch or less (see FIG. 4). The board is then passed to a soldering station 40 having means for producing concentrated vibrations in a localized portion of a body of molten solder therein and at a vibration frequency to impart sufficient vibrational energy to the molten solder to clean board lands and component leads. The molten solder cleans the board and component leads, and simultaneously the stabilizer material melts and is displaced by molten solder which wets the board and leads. The board is removed from contact with the molten solder and the board is allowed to cool.

An alternative soldering system is shown in FIG. 5. The system of FIG. 5 is similar to that as in FIG. 1, in which, however, stabilizer material is applied to an unloaded board (treating station 32A). The stabilizer material is substantially hardened (hardening station 34A) as in the embodiment of FIG. 1 previously described, and the board is then passed to insertion station 24A wherein electrical and electronic components 22 are loaded in predetermined positions in holes 28 formed in the board 20. As before, the components may be inserted in the board by any method known in the art. It should be noted that the component leads 26 are sufficiently hard as compared to material 36 so that the leads may penetrate the material without experiencing any substantial resistance. That is to say, the leads may typically be pushed through the material without bending. The material surrounds the leads for a distance, thus stabilizing the components by the leads. The loaded board is then passed to a lead trimming station 38 wherein the component excess leads are cut to finish length (e.g. 1/18 inch or less). Soldering at a soldering station 40 is also as in FIG. 1.

Although not shown, it will be understood that stabilizer build-up (FIG. 1 or FIG. 4) may be readily controlled by simply skimming the excess from the top of the liquid solder in station 40.

The following examples illustrate more clearly the manner in which printed circuit boards may be assembled and mass soldered according to the present invention. The invention however should not be construed as limited to the particular embodiments set forth in the examples.

EXAMPLE I

Referring to FIG. 1, a circuit board assembly is produced as follows: The components are loaded into predetermined position in the board (station 24). The loaded board is then preheated (station 30) to a top surface temperature of about 125°-150°F prior to treating with molten Candelilla wax (refined) by passing the bottom of the board through a wave of the molten wax (station 32). The latter is formed in a Hollis Stabilizer 100 stabilizer base (manufactured by Hollis Engineering, Inc., Nashua, New Hampshire). The latter comprises principally a wave soldering base which, however, was modified to maintain a sump temperature of only about 170°F. The board has a residence time of two seconds in the wave. The waxed board is cooled under flowing air at ambient temperature (station 34), whereupon the wax solidifies to form a cement coupling the board and leads. The resulting board after cooling below the solidus temperature of the wax appears substantially as shown in FIG. 3 of the drawings, and components are found to be stabilized in position in the board. The component leads are then cut to about 1/16 inch below the bottom surface of the board using a rotary lead cutter (station 38). The resulting board after the leads are cut appears substantially as shown in FIG. 4 of the drawings. The board is then passed to a soldering station (40) comprising a Hollis Model TDC-12 Wave Soldering device containing a body of molten 63/37 solder (63 wt. percent tin, 37 wt. percent lead) (m.p. 360°F). The solder wave is approximately 14 inches long, 3 inches wide and about ¾ inch deep. An ultrasonic horn is mounted in the solder wave about ⅛ to ¼ inch below the surface of the solder. The horn is mechanically coupled to a power transformer which has a power input of about 1250 watts, and which is operated at approximately 20 kHz. The horn has a vibratory amplitude of about 0.0002 inch; all resulting in solder globules ranging from infinitestinally small diameters to a maximum of about 0.0006 to about 0.0008 inch diameter. The wax melts upon exposure to the molten solder, and the board and component leads are scrubbed clean of oxides and wax, then the components are soldered to the board in a single operation. The melted wax forms a coating on the molten solder. The board is removed from the solder wave, and the board is allowed to cool. The assembled board tests out perfectly.

EXAMPLES II – IV

Circuit board assemblies are produced as in Example I, in which, however, the stabilizer materials and treating station temperatures are as follows:

| Ex. No. | Cement | Treating Station Temperature |
|---------|--------|------------------------------|
| III | Beeswax | 170°F |
| IV | Ozokerite Wax | 180°F |
| V | Microcrystalline Wax | 205°F |
| VI | Chevron Refined Petroleum Wax | 168°F |

Circuit board assemblies are obtained as in Example I.

EXAMPLE VII

A circuit board assembly is produced as in Example I, in which, however, a circuit board is treated with a stabilizer material prior to loading the components onto the board. Referring to FIG. 5, the board is preheated (station 30) to a top surface temperature of about 125°–150°F, treated with molten Candelilla wax (refined) by passing the bottom of the board through a wave of the molten wax (station 32A), and is cooled under flowing air at ambient temperature (station 34A) whereupon the wax solidifies to form a solid coating on the bottom of the board and in holes 28. The resulting board after cooling below the solidus temperature of the wax appears substantially as shown in FIG. 6. Electrical and electronic components are then loaded onto the board by pushing the component leads through the wax filled holes 28 (station 24A). The components are found to be stabilized in position in the board. The component leads are then cut to finish length (1/16 inch) using a rotary lead cutter (station 38) and the board is then passed to a soldering station (40) similar to the one described in Example I and the board is soldered as in Example I.

EXAMPLE VIII

Printed circuit boards are produced as in Example I in which however, the stabilizer material applied is Carbowax 4000, available from Union Carbide Corporation, New York, N.Y. The manufacturer describes this material as a polyethylene glycol having a molecular weight of about 3000–3700, apparent specific gravity at 20°C of 1.204, freezing range of about 53°–56°C, and water solubility at 20°C of about 62%. The stabilizer material is applied to the board from the melt at about 60°C. An assembled circuit board is obtained as in Example I.

Certain changes will be obvious to one skilled in the art and may be made in the above disclosure without departing from the scope of the invention herein involved. For example, instead of applying the stabilizer material to the circuit-carrying side of the board, the material can be applied to the opposite side (top surface) of the board. It will be understood that with this technique, much of the material may remain on the top surface of the board and not be melted or displaced during soldering. This procedure may have particular application in the case where it is desired to provide environmental protection to the circuit assembly. Still other changes will be obvious to one skilled in the art. For example, where no mass lead trimming equipment is available, it may be desired to trim the component leads to finish length prior to inserting the components in position on the board. It will be appreciated that the present invention may have advantages in such case as well since the components having cut leads may be stabilized in position on the board without the added operations of bending and/or crimping the leads as was typically required by the prior art. In such case, and where the board is coated prior to inserting the components, it may also be desired to reheat the board after the components have been inserted in position on the board so as to partially melt or reflow the stabilizer material. The melted material is then resolidified around the component leads e.g. as by cooling. While an ultrasonic vibrator is mentioned in the preceeding examples, it will be understood that vibrations above or in the sonic spectrum may be employed to achieve the advantages of the present invention. Also, one skilled in the art will recognize that the vibratory energy imparted to the solder will also heat the solder to some extent. However, as is clear from the preceeding, the primary purpose of using vibratory energy, and the principal advantage results from the cleaning effects. Accordingly, it is intended that all matter contained in the above description or shown in the accompanying drawings shall be interpreted in an illustrative and not in a limiting sense.

What is claimed is:

1. A method of mass joining with solder printed circuit boards having mounted thereon components with leads extending through holes in lands on the board, said method comprising the steps of:
   holding said components in position in said board by coupling said lands and leads to one another with a solid stabilizer material which is compatible with said solder and has a melting point below that of said solder, and
   immersing said board and leads at least in part in a molten body of said solder to which vibratory energy is imparted so as simultaneously to melt said stabilizer material and scrub said lands and leads to remove oxides and said materials therefrom, and to wet said lands and leads with said molten body of solder.

2. A method according to claim 1 further including the step of trimming the component leads prior to immersing said board and leads in said molten body of solder.

3. A method according to claim 2 wherein said leads are trimmed after said components are mounted on said board.

4. A method of mass joining with solder electrical and electronic components assembled in a circuit board wherein the components have leads which extend through holes in lands on the board, and excess lengths of said component leads are trimmed prior to soldering said method comprising the steps in sequence of:
   a. holding said components in position on said board by coupling said lands and leads to one another with a solid stabilizer material which is compatible with said solder and has a melting point below that of said solder;

b. trimming said leads;
c. immersing said board and leads at least in part in a molten body of said solder to which vibratory energy is imparted so as simultaneously to melt said stabilizer material and to scrub said lands and leads to remove oxides and said stabilizer material therefrom, and to wet said lands and leads with said molten body of solder.

5. A method according to claim 4 wherein said solder-compatible stabilizer material has a melting point temperature in the range of about 120°–205°F.

6. A method according to claim 4 wherein said solder-compatible stabilizer material is selected from the group consisting of waxes, resins and polymers.

7. A method according to claim 6 wherein said stabilizer material comprises a naturally occurring wax.

8. A method according to claim 7 wherein said naturally occurring wax comprises a vegetable wax.

9. A method according to claim 7 wherein said naturally occurring wax comprises an animal wax.

10. A method according to claim 7 wherein said naturally occurring wax comprises a petroleum derived mineral wax.

11. A method according to claim 6 wherein said stabilizer material comprises a synthetic wax derived from a Fischer-Tropsch synthesis.

12. A method according to claim 6 wherein said stabilizer material comprises a resin selected from the group consisting of alkyl resins and dipentene resins.

13. A method according to claim 6 wherein said stabilizer material is a polymeric material selected from the group consisting of polyethylene, a polyethylene glycol, polybutene, and polyindene.

14. A method according to claim 6 wherein said stabilizer material comprises a water soluble polymeric material.

15. A method according to claim 4 wherein said solder-compatible stabilizer material is applied to said lands and leads as a selected liquid material, and including the step of hardening said liquid.

16. A method according to claim 4 wherein said stabilizer material is applied to said lands prior to assembling said components onto said board, and the components are loaded in position on said board by forcing said leads into or through said material for a distance.

17. A method according to claim 16 including the step of reflowing and then rehardening said stabilizer material.

18. A system for mass joining with solder electrical and electronic components assembled in a circuit board wherein the components have leads which extend through holes in lands on said board, and comprising in combination: means for applying to said board a solid stabilizer material which is compatible with said solder and has a melting point below that of said solder; and, an ultrasonic soldering station adapted to apply to said lands and leads a molten body of said solder to which vibratory energy is imparted so as to scrub said lands and leads to remove oxides and said stabilizer material therefrom, and to simultaneously wet said lands and leads with molten solder.

19. A system according to claim 18 wherein said means for applying said stabilizer material comprises a container adapted to maintain a liquid body of said material.

20. A system according to claim 19 wherein said container includes means for heating said stabilizer material so as to maintain said material as a melt.

21. A system according to claim 19 including means for forming said liquid as a moving wave.

22. A system according to claim 20 further including means for hardening said material after the latter is applied to said lands and leads.

23. A system according to claim 22 wherein said means for hardening comprises cooling means.

24. A system according to claim 22 wherein said means for hardening comprises heating means.

25. A system according to claim 22 wherein said means for hardening comprises means for treating said material with a chemical agent which agent causes said material to harden.

26. A system according to claim 22 wherein said means for hardening comprises means for exposing said material to ultraviolet light.

27. A system according to claim 18 further including means for positioning said components at predetermined positions on said board.

28. A system according to claim 18 further including means for trimming said components to a predetermined length prior to soldering.

* * * * *

UNITED STATES PATENT OFFICE
CERTIFICATE OF CORRECTION

PATENT NO. : 3966110
DATED : June 29, 1976
INVENTOR(S) : Kenneth G. Boynton

It is certified that error appears in the above-identified patent and that said Letters Patent are hereby corrected as shown below:

Column 10, line 47, the term -- material -- should be substituted for the term "materials".

Signed and Sealed this

Fourteenth Day of September 1976

[SEAL]

Attest:

RUTH C. MASON
Attesting Officer

C. MARSHALL DANN
Commissioner of Patents and Trademarks